US005797121A

United States Patent [19]
Fette et al.

[11] Patent Number: 5,797,121
[45] Date of Patent: Aug. 18, 1998

[54] METHOD AND APPARATUS FOR IMPLEMENTING VECTOR QUANTIZATION OF SPEECH PARAMETERS

[75] Inventors: Bruce Alan Fette, Mesa; Shirley Hsiao-Mei Lee, Chandler, both of Ariz.

[73] Assignee: Motorola, Inc., Schaumburg, Ill.

[21] Appl. No.: 578,818

[22] Filed: Dec. 26, 1995

[51] Int. Cl.$^6$ ................................................. G10L 9/00
[52] U.S. Cl. ......................... 704/230; 704/219; 704/220
[58] Field of Search ........................ 395/2.39; 704/230, 704/228, 219, 220, 222, 223

[56] References Cited

U.S. PATENT DOCUMENTS

| | | | |
|---|---|---|---|
| 4,815,134 | 3/1989 | Picone et al. | 395/2.31 |
| 5,060,269 | 10/1991 | Zinser | 704/219 |
| 5,073,940 | 12/1991 | Zinser et al. | 395/2.39 |
| 5,371,853 | 12/1994 | Kao et al. | 395/2.32 |
| 5,384,891 | 1/1995 | Asakawa et al. | 395/2.39 |
| 5,457,783 | 10/1995 | Chhatwal | 395/2.28 |
| 5,537,509 | 7/1996 | Swaminathan et al. | 704/228 |
| 5,583,967 | 12/1996 | Akagiri | 395/2.39 |
| 5,588,089 | 12/1996 | Beerends et al. | 395/2.39 |
| 5,602,961 | 2/1997 | Kolesnik et al. | 395/2.32 |

OTHER PUBLICATIONS

An article entitled "A Hardware Processor for Implementing the Pyramid Vector Quantizer" by Q. A. Qureshi et al., *IEEE Transactions on Acoustics, Speech, and Signal Processing*, vol. 37, No. 7, Jul. 1989, pp. 1135–1142.

An article entitled "A VLSI Architecture for Real-Time Image Coding Using a Vector Quantization Based Algorithm" by K. Dezhgosha et al., *IEEE Transactions on Signal Processing*, vol. 40, No. 1, Jan. 1992, pp. 181–189.

An article entitled "A VLSI Neural Procssor for Image Data Comprission Using Self-Organization Networks" by W. Fang et al., *IEEE Transactions on Neural Networks*, vol. 3, No. 3, May 1992, pp. 506–518.

An article entitled "An All Digital Implementation of a Modified Hamming Net for Video Compression with Prediction and Quantization Circuits" by R. Kaul et al., *IEEE*, ©1991, pp. 214–217, Aug. 1991.

An article entitled "An Integrated Circuit Design for Pruned Tree-Search Vector Quantization Encoding with an Off-Chip Controller" by Rajeev Jain et al., *IEEE Transactions on Circuits and Systems for Video Technology*, vol. 2, No. 2, Jun. 1992, pp. 147–158.

An article entitled "ASIC Chip for Real-time Vector Quantization of Video Signals" by C. Chan et al., *SPIE Visual Communications and Image Processing '92*, vol. 1818, 1992, pp. 1566–1573, Nov. 1992.

An article entitled "MU9C1640 CacheCAM™" *Music Semiconductors*, Jul. 23, 1993 Rev. 0, pp. 1–12.

Xilinx Corp. *The Programmable Sale Array Data Book* (1989).

An article entitled "Neural Circuit Architectures for Real-Time Signal Processing in Video Rate Communication Systems", by S. Bibyk et al., *IEEE*, ©1991, pp. I–557 thru I–562, Jul. 1991.

An article entitled "Vector-centered CAM architecture for image coding using vector quantization" by S. Panchanathan et al., *SPIE Visual Communications and Image Processing IV*, vol. 1199, 1989, pp. 1084–1094, Nov. 1989.

*Primary Examiner*—Richemond Dorvil
*Attorney, Agent, or Firm*—Frank J. Bogacz

[57] ABSTRACT

A vocoder (10) includes a digital signal processor (18) and a vector quantizer (28) implemented in hardware external to the digital signal processor (18). The vector quantizer (28) includes an analysis codebook (32) having a multitude of scalar quantized code vectors (60). A frame of digitized speech is translated into speech parameters, which are then scalar quantized to form a source vector. This scalar quantized source vector is then vector quantized in the vector quantizer (28) prior to transmission into a communication channel (22). A separate synthesis codebook (30) is used in decompressing vocoded speech received from the communication channel (22).

16 Claims, 5 Drawing Sheets

| CODEBOOK | LSF1 | LSF2 · LSF1 | LSF3 · LSF2 | LSF4 · LSF3 | LSF5 · LSF4 | LSF6 · LSF5 | LSF7 · LSF6 | LSF8 · LSF7 | LSF9 · LSF8 | LSF10 · LSF9 |
|---|---|---|---|---|---|---|---|---|---|---|
| CODE VECTOR 0 | ||||| | ||||| | ||||| | |||| | ||| | ||| | ||| | || | || | || |
| CODE VECTOR 1 | ||||| | ||||| | ||||| | |||| | ||| | ||| | ||| | || | || | || |
| ... | ... | ... | ... | ... | ... | ... | ... | ... | ... | ... |
| CODE VECTOR $2^N-1$ | ||||| | ||||| | ||||| | |||| | ||| | ||| | ||| | || | || | || |

FIG. 3

METHOD AND APPARATUS FOR IMPLEMENTING VECTOR QUANTIZATION OF SPEECH PARAMETERS

FIELD OF THE INVENTION

The present invention relates generally to digital speech analysis. More specifically, the present invention relates to linear predictive vocoders which perform vector quantization.

BACKGROUND OF THE INVENTION

Human voice is a common type of information to communicate from one location to another and to save for future use. For digital communication and storage systems to accommodate voice, the voice signals must be digitized. Unfortunately, voice signals are so complex that large amounts of data are required to accurately describe them. For example, the worldwide DS-0 communication standard describes voice signals limited to frequencies less than 4000 Hz using a 64 kbps data rate. This is an excessive data rate for many applications, such as RF communications which must conserve the electromagnetic spectrum, modem communications which are confined to occur at data rates less than 64 kbps, and storage applications which must conserve memory.

To reduce the data rate, many applications employ vocoders. A vocoder includes a speech analyzer and a speech synthesizer. The analyzer performs a compression process on speech, and the synthesizer performs a complementary expansion process. Vocoder analysis is a complex process due to the complexity of speech signals. In a typical scenario, frames of speech are digitized and transformed into speech parameters which describe the digitized speech. Typically, the speech parameters describe frequency resonances of a modeled human voice tract. Ten speech parameters are typically formed for each frame of digitized speech. The parameters may be characterized as linear spectral frequencies, reflection coefficients, Cepstral coefficients, or the like. Due to the complexity of speech and the human ear's ability to discern minor amounts of audio distortion, the ten speech parameters are conventionally described using high precision values. Since high precision values are characterized using many bits of data and since ten speech parameters are described to high precision for each frame of speech, an insufficient amount of compression results merely from generating these speech parameters.

Accordingly, a process known as vector quantization (VQ) is conventionally performed on these speech parameters to achieve further compression. The ten speech parameters taken together are called a source vector. Briefly, vector quantization is the process of searching a codebook which has a multitude of multi-dimensional (typically ten) code vectors to determine which code vector in the codebook most closely resembles the source vector. The VQ search is a computationally intense process because every code vector in the codebook must be evaluated to determine how closely it matches the source vector.

Conventionally, the VQ search process has been performed in a digital signal processor (DSP). Typically, the DSP performs VQ searching using nested programming loops. An inner programming loop evaluates each of the ten high precision speech parameters one at a time for a single code vector and forms a summary statistic which indicates how closely a source vector matches the code vector. An outer programming loop repeats the inner loop for each code vector in the codebook. The use of a digital signal processor is desirable because the same digital signal processor can perform VQ searching along with most other vocoder functions at a reasonable cost. However, a significant amount of vocoder computations are expended solely on the VQ search process.

In order to achieve lower baud rates while maintaining currently achievable reconstructed speech quality or to achieve higher reconstructed speech quality using currently achievable low baud rates, more complex VQ searching processes are required. For example, multi-stage VQ processes require multiple VQ searches for each frame of speech, and other improvements can be achieved by performing VQ searches using larger codebooks. Unfortunately, conventional DSPs do not provide sufficient computational power to perform these more complex searches. In the field of video compression, special purpose hardware has been designed to implement VQ searches quickly. However, such designs are impractical when applied to speech analysis because the hardware required to process the high precision numbers conventionally used in speech analysis is excessively complex and expensive.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 3 shows a block diagram of an exemplary memory structure which implements a vector quantization codebook;

FIG. 7 shows a flow chart of a synthesis process performed by the digital signal processor.

DETAILED DESCRIPTION OF THE DRAWINGS

Figure 1:
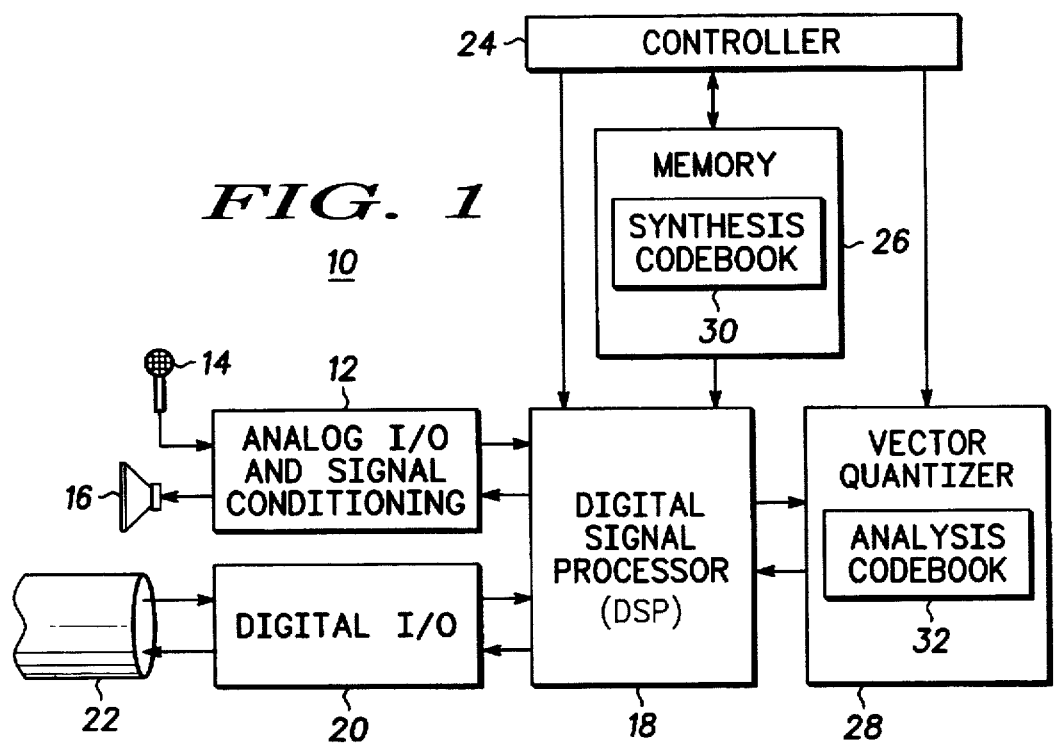
FIG. 1 shows a block diagram of a vocoder configured in accordance with the teaching of the present invention.

FIG. 1 shows block diagram of a vocoder 10 configured in accordance with the teaching of the present invention. Vocoder 10 includes an analog I/O and signal conditioning section 12. An analog input signal, such as may be generated by a microphone 14, is received at section 12. An analog output signal, such as may be routed to a speaker 16, is generated at section 12. Section 12 conditions and digitizes the input signal prior to passing the digitized input signal to a digital signal processor (DSP) 18. In addition, section 12 generates its analog output signal from a digital signal received from DSP 18.

DSP 18 couples to a digital I/O section 20. Section 20 passes digital data between DSP 18 and a digital communication channel 22. Channel 22 may extend from vocoder 10 to a communication device, a storage device, or any device that receives, stores, and/or generates digital data.

DSP 18 also couples to a controller 24, a memory 26, and a vector quantizer 28. Controller 24 may be implemented using a microprocessor or state machine and associated peripheral devices. Memory 26 may desirably couple to controller 24 as well as to DSP 18. Memory 26 stores programming instructions which control the operation of DSP 18 and controller 24, along with variables, tables, databases, and other memory structures used in the operation of DSP 18 and controller 24. One of these memory structures is a synthesis codebook 30, which is discussed in more detail below. Vector quantizer 28 includes hardware external to DSP 18 which performs a vector quantization (VQ) operation using an analysis codebook 32. Vector quantizer 28 is configured to perform many of the computations required by a VQ search algorithm in parallel rather than one at a time as would be required if performed in DSP 18.

Figure 2:
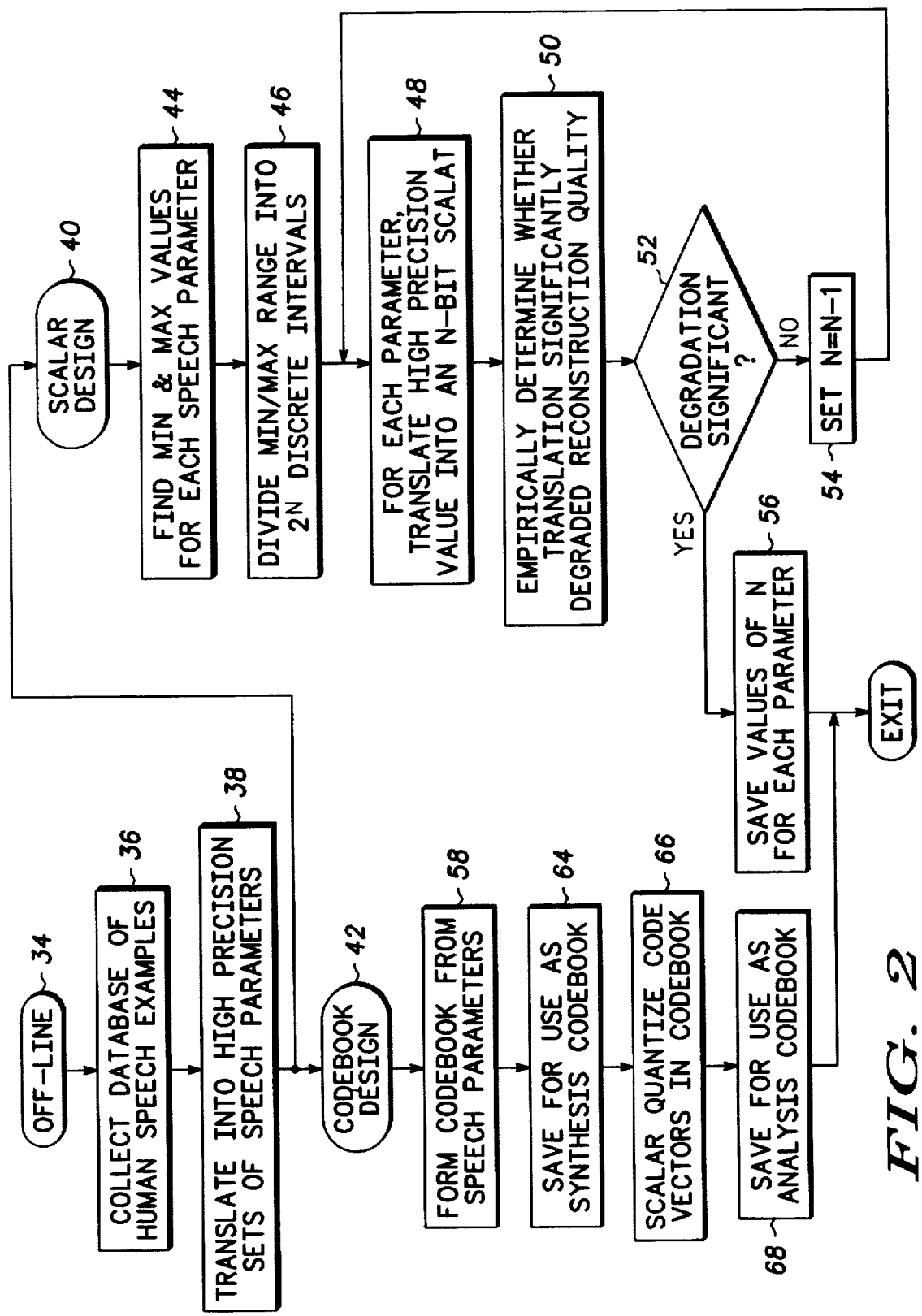
FIG. 2 shows a flow chart of an off-line VQ and scalar design process performed to support the vocoder.

FIG. 2 shows a flow chart of an off-line design process 34 performed to support vocoder 10 (see FIG. 1). Process 34 is performed during the design phase of vocoder 10 to generate codebooks 30 and 32 (see FIG. 1) and scalar quantization parameters which are used in the operation of vocoder 10. Process 34 includes a task 36 in which a database of human speech examples is collected. This database desirably includes a wide range of speech examples taken from a wide variety of speakers.

Next, a task 38 translates the database speech examples into a multitude of high precision sets of speech parameters. In the preferred embodiments, for each speech example the speech parameters are desirably configured as the well-known ten linear predictive analysis speech parameters which may be characterized as linear spectral frequencies, reflection coefficients, Cepstral coefficients, differences between such parameters, or the like. Moreover, the speech parameters are desirably specified as precisely as reasonably possible. For example, the speech parameters may be expressed as floating point numbers or 24 to 48 bit integers. Accordingly, each speech example is defined using ten different high precision values.

After task 38, both a scalar design process 40 and a codebook design process 42 are performed. Scalar design process 40 identifies how to perform a scalar quantization process. Scalar design process 40 includes a task 44, which finds minimum and maximum values for each speech parameter in the database created by task 38. In other words, task 44 identifies the range over which scalar quantization will take place. Next, a task 46 divides the minimum value to maximum value ranges for each speech parameter into $2^N$ discrete intervals. Task 46 allows any value in the identified range to be expressed as an N-bit number. At task 46, N is chosen as an arbitrarily large integer number, and values for N may differ for different speech parameters.

After task 46, a task 48 translates the high precision speech parameters, for example from the database created in task 38, into N-bit scalar values. Unless the values for N are very large, this may cause a loss of precision in defining the speech parameters. Next, a task 50 reconstructs speech from the translated scalar values obtained in task 48 and empirically determines whether the translation significantly degraded the reconstruction quality. Task 50 may involve subjective judgements based upon listening to the reconstructed speech.

After task 50, a query task 52 determines whether speech quality degradation was significant. So long as speech quality degradation is deemed not significant, a task 54 reduces the values of N by 1 and process flow loops back to task 48. Task 54 may decrement the values of N for one or more of the speech parameters. The next iteration of task 48 causes the speech parameters to be quantized with one less bit of precision than in the previous iteration. When task 52 eventually determines that significant speech degradation has occurred, a task 56 resets the values of N to the minimum levels which do not yield significant speech quality degradation and saves these values of N for each speech parameter. After task 56, scalar design process 40 is complete.

Codebook design process 42 includes a task 58 which forms a vector quantization codebook from the speech parameters created above in task 38. Task 58 may employ the Lloyd, Buzo and Gray (LBG) clustering algorithm or any other codebook-forming algorithm known to those skilled in the art. Task 58 represents cluster centroids to a high level of precision compatible with the precision level obtained above in task 38.

FIG. 3 shows a block diagram of an exemplary memory structure which implements a vector quantization codebook. Briefly, the codebook includes $2^N$ code vectors 60, where N is an integer number chosen to achieve vocoder design goals. Each code vector includes 10 speech parameters 62. FIG. 3 illustrates the speech parameters 62 as being linear spectral frequencies (LSF), with the first frequency (LSF 1) coded directly and LSF 2 through LSF 10 coded as delta frequencies.

Referring back to FIG. 2, after task 58, a task 64 saves the codebook in DSP memory 26 for use as synthesis codebook 30 (see FIG. 1). Codebook 30 may be saved directly as formed in task 58 or further processed as needed. For example, high precision speech parameters 62 (see FIG. 3) may be expressed as lower precision numbers in order to conserve memory 26.

After task 64, a task 66 scalar quantizes the code vectors 60 (see FIG. 3) in the codebook generated above in task 58. Scalar quantization is performed using the discrete intervals and values of N determined in scalar design process 40. Scalar quantization may be performed using conventional processes well known to those skilled in the art. Referring to FIG. 3, scalar quantization of the codebook in accordance with one preferred embodiment of the present invention translates each code vector 60 from ten 32-bit floating point numbers to one 32 bit word having ten fields of varying length. As illustrated in FIG. 3, LSF 1 is scalar quantized using 4 bits, and subsequent delta frequencies are scalar quantized using 5, 4, 4, 3, 3, 3, 2, 2, and 2 bits, respectively. This distribution of ten speech parameter fields in a 32-bit code word reflects the results of a scalar design process 40 (see FIG. 2) performed in connection with one preferred embodiment. Referring back to FIG. 2, after task 66, a task 68 saves the scalar quantized codebook in vector quantizer 28 for use as analysis codebook 32 (see FIG. 1).

Figure 4:
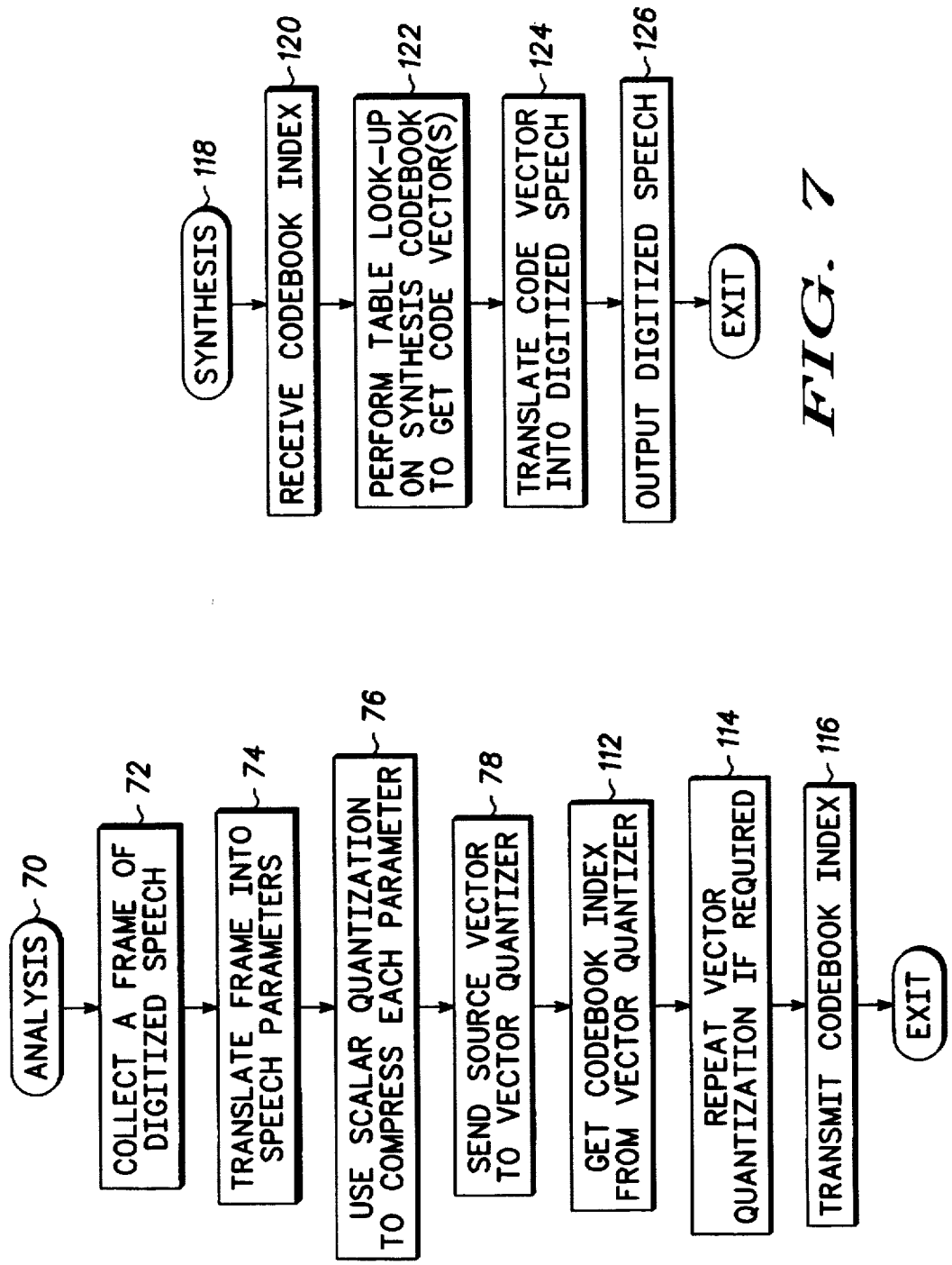
FIG. 4 shows a flow chart of an analysis process performed by a digital signal processor of the vocoder.

FIG. 4 shows a flow chart of an analysis process 70 performed by DSP 18 during the operation of vocoder 10 (see FIG. 1). In general, analysis process 70 translates uncompressed digitized speech obtained from analog I/O and signal conditioning section 12 into compressed digital data which are transmitted into communication channel 22 (see FIG. 1). Process 70 is established through software programming stored in memory 26.

Analysis process 70 includes a task 72 in which digitized speech collected over a predetermined duration is framed together. After task 72, a task 74 translates the frame of digitized speech into a plurality of speech parameters. The speech parameters used in task 74 are compatible with the speech parameters used in off-line design process 34 (see FIG. 2). In other words, if codebooks 30 and 32 are formed so that code vectors 60 thereof include ten linear spectral frequencies, then task 74 translates the frame of speech into a set of ten linear spectral frequencies.

Next, a task 76 uses scalar quantization to compress each parameter. As a result, task 76 forms a source vector of scalar quantized speech parameters. Task 76 operates in a manner similar to that described above in connection with task 66 (see FIG. 2). The discrete intervals and values of N determined in scalar design process 40 (see FIG. 2) are used with a conventional scalar quantization algorithm. Those skilled in the art will appreciate that task 76 may be performed quickly and that task 76 may be performed much more quickly than a VQ operation. After task 76, a task 78 sends the source vector of scalar quantized speech parameters to vector quantizer 28 (see FIG. 1) so that vector quantizer 28 may perform a VQ operation on the scalar quantized source vector.

Accordingly, vocoder 10 performs both a scalar quantization operation and a vector quantization operation on speech parameters. The scalar quantization operation does not allow vector quantization to achieve greater amounts of compression than could be achieved without scalar quantization. Rather, scalar quantization allows VQ operations to be performed hardware external to DS in hardware external to DSP 18.

Figure 5:
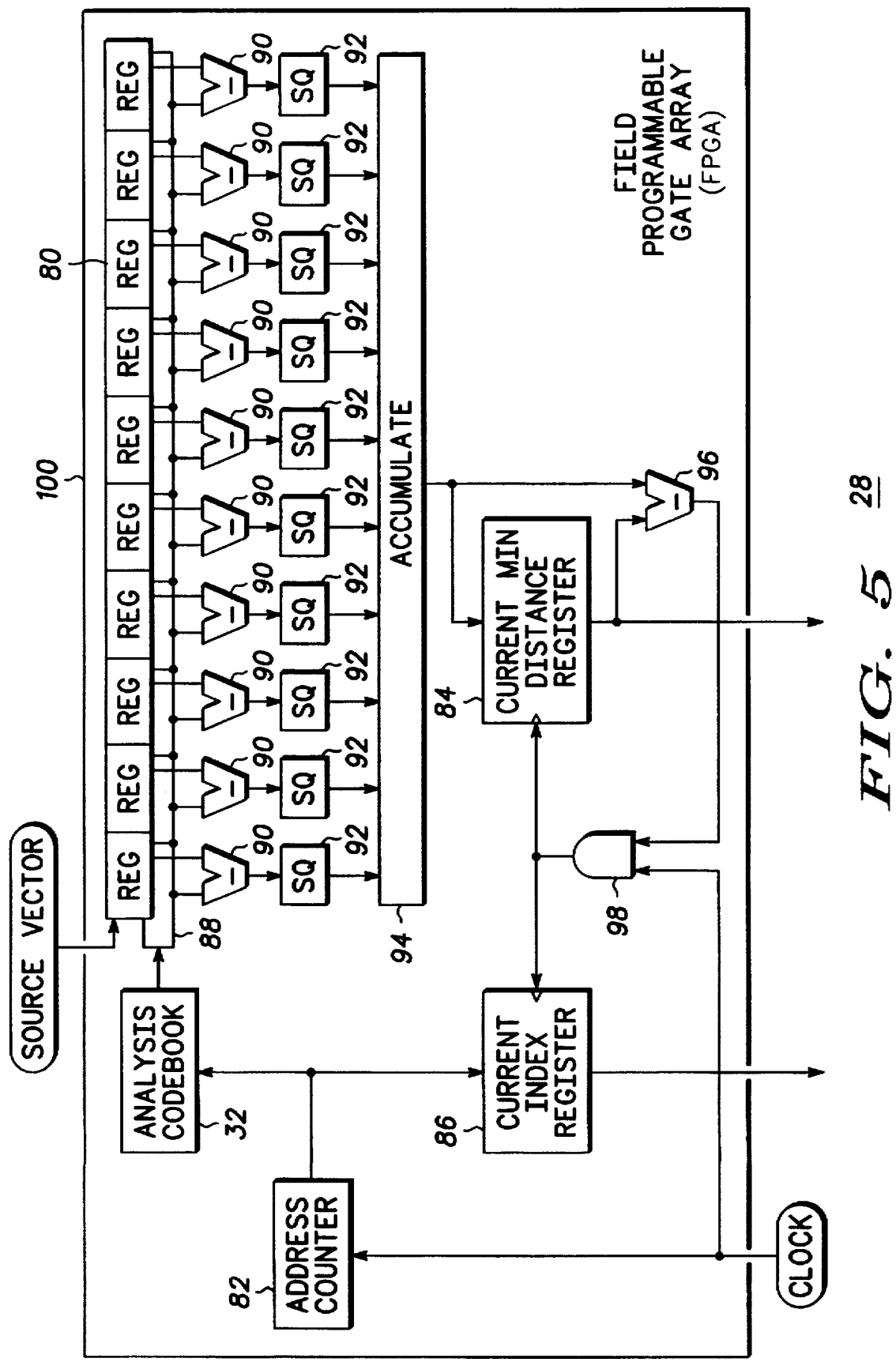
FIG. 5 shows a block diagram of a first embodiment of a vector quantizer of the vocoder.

FIG. 5 shows a block diagram of a first embodiment of vector quantizer 28 (see FIG. 1). Task 78 (see FIG. 4) loads the scalar quantized source vector into a source vector register 80. Upon activation, an address counter 82 is reset and a current minimum distance register 84 is preset with a maximum distance value. Address counter 82 has an output which couples to address inputs of analysis codebook 32 and to data inputs of a current index register 86. Data outputs of codebook 32 couple to data inputs of a code vector register 88. The address value presented to codebook 32 initiates a table look-up operation which causes the indexed code vector 60 to be read from codebook 32 and loaded into code vector register 88.

Respective outputs from e vector register 88 and source vector register 80 couple to complementary inputs of subtractors 90. One subtractor 90 is used for each speech parameter, and each subtractor 90 desirably processes as many bits as are included in corresponding fields of scalar quantized source and code vectors. Thus, for each scalar quantized speech parameter, a subtractor 90 independently and concurrently compares the source vector with a selected code vector.

Outputs of subtractors 90 couple to inputs of respective squaring circuits 92. Thus, circuits 92 square the difference between source and code vectors for each speech parameter. Outputs of squaring circuits 92 couple to inputs of an accumulation circuit 94. Accumulation circuit 94 determines the sum of the squared differences between each speech parameter of the source and code vectors. This sum represents the distance between the selected code vector and the source vector. In particular, subtractors 90, squaring circuits 92, and accumulator 94 form a Euclidean distance measuring circuit. However, those skilled in the art will appreciate that other distance measuring techniques, such as Chebychev, can be implemented as well.

The output of accumulation circuit 94 couples to a data input of current minimum distance register 84 and to an input of a comparison circuit 96. A data output of minimum distance register 84 couples to another input of comparison circuit 96 and serves as an output from vector quantizer 28. A "less than" output from comparison circuit 96 couples to one input of an enabling circuit 98. A clock signal is applied to a clock input of address counter 82 and to another input of enabling circuit 98. An output of enabling circuit 98 couples to clock inputs of current minimum distance register 84 and to current index register 86.

Comparison circuit 96 compares the current minimum distance stored in register 84 with the new distance obtained directly from accumulation circuit 94. If the new distance from circuit 94 is less than the current minimum distance, then the less than output activates and enables enabling circuit 98 so that the new distance will become the current minimum distance stored in register 84. When register 84 is updated, the address or index of the code vector 60 which produced this new distance is loaded into current index register 86. After a number of clocks of the clock signal equal to the length of codebook 32, vector quantizer 28 has evaluated all code vectors 60 against the source vector and identified the codebook index of the code vector 60 having the smallest distance relative to the source vector.

In this embodiment of several possible embodiments of vector quantizer 28, all of vector quantizer 28, except perhaps for analysis codebook 32 depending upon the configuration, is implemented in a field programmable gate array (FPGA) 100. One such desirable FPGA is provided by the XILINX Corporation. Using the FPGA implementation, configurable logic blocks are programmed to perform the structure illustrated in FIG. 5. FPGA implementation is made possible through the scalar quantization process which first compresses the high precision numbers included in speech parameters to a level which can be managed by the FPGA. It is to be onted that FPGA is a preferred implementation; however, LSI circuitry, gate arrays or even discrete transistors may be use for the implementation.

Figure 6:
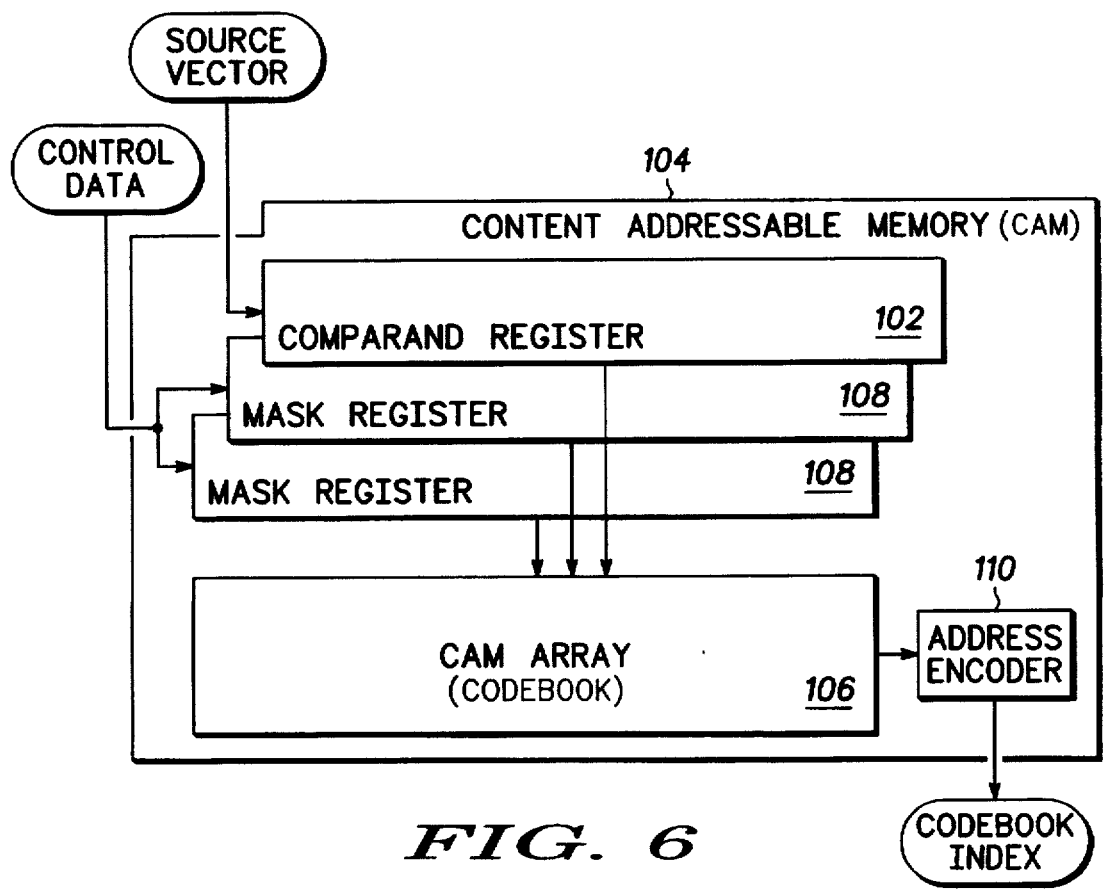
FIG. 6 shows a block diagram of a second embodiment of the vector quantizer.

FIG. 6 shows a block diagram of a second embodiment of vector quantizer 28 (see FIG. 1). In accordance with this second embodiment, task 78 (see FIG. 4) loads the scalar quantized source vector into a comparand register 102 of a content addressable memory (CAM) 104. Analysis codebook 32 is stored in a cam array 106 of CAM 104. Control inputs from controller 24 (see FIG. 1) are loaded into mask registers 108. Upon loading comparand register 102, each cell of CAM array 106 processes the data loaded in comparand register 102 to determine whether the data stored in the cell matches the source vector. Thus, in a single clock cycle all code vectors 60 (see FIG. 3) are evaluated against a source vector. When no matches are found, control data masks and source vector values may be dithered in subsequent clock cycles until a match is found at a minimum distance from the original source vector. When the minimum distance code vector match is found, an address encoder 110 forms an index which serves as an output from vector quantizer 28.

In this second embodiment of vector quantizer 28, each speech parameter of each code vector in codebook 32 is independently and concurrently compared to corresponding speech parameters of the source vector. Moreover, substantially all of vector quantizer 28 is implemented in CAM 104. One desirable CAM in which vector quantizer 28 may be implemented is provided by the MUSIC Semiconductor Corporation. CAM implementation is made possible through the scalar quantization process which first compresses the high precision numbers included in speech parameters to a level which can be managed by the CAM.

Referring back to FIG. 4, after task 78 sends the scalar quantized source vector to vector quantizer 28, and vector quantizer 28 generates a codebook index through its vector quantization operation, a task 112 gets the codebook index from vector quantizer 28. Next, a task 114 repeats the vector quantization operation of tasks 78 and 112 as needed for a vocoder implementation. For example, multi-stage processes may use subsequent VQ operations to compress residual errors resulting from previous VQ operations. After task 114, a task 116 transmits the codebook index data through digital I/O section 20 (see FIG. 1).

While the above-presented description describes the analysis of a single frame of speech, those skilled in the art will appreciate that pipelining is desirably implemented so that vocoder 10 simultaneously analyzes several frames of speech, and each of the several frames is in a different stage of the analysis process. Accordingly, while FIG. 4 indicates that process flow exits after task 116, those skilled in the art will appreciate that process 70 exits only with respect to the one analyzed frame of speech. Different frames of speech are at different points within process 70 at any given point in time.

FIG. 7 shows a flow chart of a synthesis process 118 performed by DSP 18. While analysis process 70 (see FIG. 4) is performed for the transmitting side of vocoder 10, synthesis process 118 is performed for the receiving side of vocoder 10. In general, synthesis process 118 translates compressed digital data obtained from communication channel 22 into uncompressed digital speech data which may be converted into analog form for presentation to a listener. Process 118 is established through software programming stored in memory 26.

Process 118 includes a task 120 which receives compressed digital data in the form of a codebook index. A task 122 performs one or more table look-up operations using this codebook index (or indices) and synthesis codebook 30 (see FIG. 1). Table look-up task 122 may be performed quickly by DSP 18 and may be performed much more quickly than VQ operations. Task 122 produces one or more code vectors, depending upon whether multi-stage vector quantization has been implemented. As discussed above, analysis codebook 32 represents code vectors 60 to a relatively low degree of precision to efficiently accommodate VQ operations in hardware external to DSP 18. Nothing requires synthesis codebook 30 to represent code vectors 60 (see FIG. 3) to the same low degree of precision used by analysis codebook 32. Thus, synthesis codebook 30 may desirably represent code vectors using higher precision values than are used in analysis codebook 32.

After task 122, a task 124 translates the code vector into digitized speech using conventional techniques, and a task 126 outputs digitized speech to digital I/O section 20 (see FIG. 1). Although FIG. 7 depicts process 118 as exiting after task 126, those skilled in the art will appreciate that process 118 exits only with respect to the single codebook index obtained above in task 120.

In summary, the present invention provides an improved method and apparatus for implementing vector quantization of speech parameters. VQ operations are removed from a DSP. This frees significant DSP computational power for other tasks while allowing the VQ operation to be performed quickly and efficiently. A practical VQ search process is implemented in hardware external to the DSP without requiring computations on high precision numbers. In particular, a scalar quantization process compresses a high precision source vector prior to vector quantization so that the VQ hardware operates on the scalar quantized source vector. Thus, VQ operations may be performed in hardware by efficient hardware components, such as FPGAs and CAMs. The quick VQ operation provided by the present invention allows vocoders to match currently achievable reconstructed speech quality at lower baud rates than those currently used or to improve reconstructed speech quality at currently achievable low baud rates.

The present invention has been described above with reference to preferred embodiments. However, those skilled in the art will recognize that changes and modifications may be made in these preferred embodiments without departing from the scope of the present invention. For example, those skilled in the art will appreciate that the process tasks identified herein may be categorized and organized differently than described herein while achieving equivalent results and that ten parameter is used as an example. Likewise, those skilled in the art will appreciate that the present invention may be applied to a wide variety of linear predictive vocoder and speech analysis techniques. These and other changes and modifications which are obvious to those skilled in the art are intended to be included within the scope of the present invention.

What is claimed is:

1. A method for vector quantization of speech parameters comprising the steps of;

forming at least two codebooks having a multiplicity of code vectors;

processing a voice signal in a plurality of speech parameters;

scalar quantizing each of said speech parameters to obtain a source vector of scalar quantized speech parameters; and vector quantizing said source vector in response to said codebook;

said step of forming at least two codebooks including the step of providing a vector quantizer codebook which includes a plurality of scalar quantized speech parameters; and said step of forming at least two codebooks including the step of providing a synthesis codebook, said synthesis codebook being configures so that each parameter therein has a corresponding parameter in said vector quantizer codebook, said synthesis codebook is configured so that each parameter therein is expressed as a high precision number compared to said scalar representation for said corresponding parameter in said vector quantizer codebook.

2. A method as claimed in claim 1 additionally comprising the step of configuring said codebook so that each code vector includes a plurality of scalar quantized speech parameters.

3. A method as claimed in claim 2 wherein said vector quantizing step comprises the steps of:

independently and concurrently comparing each of said source vector speech parameters with a corresponding speech parameter from at least one of said code vectors; and identifying, in response to said comparing step, one of said code vectors whose distance to said source vector is less than distances from said source vector to all other code vectors.

4. A method as claimed in claim 1 additionally comprising the steps of:

performing said processing and scalar quantizing steps in a digital signal processor (DSP); and performing said vector quantizing step in hardware external to said DSP.

5. A method as claimed in claim 4 additionally comprising the step of configuring said hardware external to said DSP to include a field-programmable gate array (FPGA).

6. A method as claimed in claim 4 additionally comprising the step of configuring said hardware external to said DSP to include a content-addressable memory (CAM).

7. A vocoder configured to implement vector quantization of speech parameters, said vocoder comprising:
- a digital signal processor configured to process a voice signal into a plurality of speech parameters and to scalar quantize each of said speech parameters to obtain a source vector of scalar quantized speech parameters;
- a vector quantizer having a codebook which includes a multiplicity of code vectors, said vector quantizer being coupled to said digital signal processor, and said vector quantizer being configured to vector quantize said source vector in response to said codebook;
- said vector quantizer codebook is configured so that each code vector includes a plurality of scalar quantized speech parameters;
- a synthesis codebook, coupled to said digital signal processor, said synthesis codebook being configured so that each parameter therein has a corresponding parameter in said vector quantizer codebook, said synthesis codebook is configured so that each parameter therein is expressed as a high precision number compared to said scalar representation for said corresponding parameter in said vector quantizer codebook.

8. A vocoder as claimed in claim 7 wherein said vector quantizer is configured to independently and concurrently compare each of said source vector speech parameters with a corresponding speech parameter from at least one of said code vectors, and to identify one of said code vectors whose distance to said source vector is less than distances from for all other code vectors to said source vector.

9. A vocoder as claimed in claim 7 wherein said vector quantizer is configured to include a field-programmable gate array (FPGA).

10. A vocoder as claimed in claim 7 wherein said vector quantizer is configured to include a content-addressable memory (CAM).

11. A method for vocoding voice signals comprising the steps of:
- forming at least two codebooks having a multiplicity of code vectors, wherein each code vector includes a plurality of scalar quantized speech parameters;
- processing a voice signal into a plurality of speech parameters;
- scalar quantizing each of said speech parameters to obtain a source vector of scalar quantized speech parameters;
- independently and concurrently comparing each of said source vector speech parameters with a corresponding speech parameter from at least one of said code vectors; and identifying, in response to said comparing step, one of said code vectors whose distance to said source vector is less than distances from said source vector to all other code vectors;

said step of forming at least two codebooks including the step of providing a vector quantizer codebook which includes a plurality of scalar quantized speech parameters; and said step of forming at least two codebooks including the step of providing a synthesis codebook, said synthesis codebook being configured so that each parameter therein has a corresponding parameter in said vector quantizer codebook, said synthesis codebook is configured so that each parameter therein is expressed as a high precision number compared to said scalar representation for said corresponding parameter in said vector quantizer codebook.

12. A method as claimed in claim 11 additionally comprising the steps of:
performing said processing and scalar quantizing steps in a digital signal processor (DSP); and
performing said vector quantizing step in hardware external to said DSP.

13. A method as claimed in claim 12 additionally comprising the step of configuring said hardware external to said DSP to include a field-programmable gate array (FPGA).

14. A method as claimed in claim 12 additionally comprising the step of configuring said hardware external to said DSP to include a content-addressable memory (CAM).

15. A method as claimed in claim 11 wherein said codebook is a vector quantizer codebook, and said method additionally comprises the steps of:
forming a synthesis codebook having a multiplicity of synthesis code vectors, wherein each synthesis code vector includes a plurality of speech parameters configured so that each synthesis parameter has a corresponding parameter in said vector quantizer codebook;
receiving a codebook index;
selecting a code vector from said synthesis codebook in response to said codebook index; and
translating said selected code vector into speech samples.

16. A method as claimed in claim 15 wherein said synthesis codebook forming step represents each synthesis parameter as a high precision number compared to said scalar representation for said corresponding parameter in said vector quantizer codebook.

* * * * *